United States Patent [19]

Agostinelli et al.

[11] Patent Number: 4,956,335
[45] Date of Patent: Sep. 11, 1990

[54] CONDUCTIVE ARTICLES AND PROCESSES FOR THEIR PREPARATION

[75] Inventors: John A. Agostinelli, Rochester; Gerrit Lubberts, Penfield, both of N.Y.

[73] Assignee: Eastman Kodak Company, Rochester, N.Y.

[21] Appl. No.: 208,706

[22] Filed: Jun. 20, 1988

[51] Int. Cl.$^5$ ................................................ B32B 3/00
[52] U.S. Cl. ....................................... 505/1; 505/700; 505/701; 505/702; 505/704; 505/725; 505/728; 29/599; 428/209; 428/457; 428/688; 428/901; 428/930; 427/62; 427/96; 427/102; 427/103; 156/625; 156/629; 156/630; 156/631
[58] Field of Search .................. 505/1, 700, 701, 702, 505/704, 725, 728, 732, 741, 775, 776–781; 29/399; 428/209, 457, 688, 901, 930; 427/96, 102, 103, 117, 118, 120; 156/625, 629.31, 659.1; 430/311

[56] References Cited

FOREIGN PATENT DOCUMENTS 0292387 11/1988 European Pat. Off. .
224825 6/1989 Japan .

OTHER PUBLICATIONS

J. G. Bednorz et al., "Possible High $T_c$ Superconductivity in the Ba–La–Cu–O System", *Z. Phys. B.-Condensed Matter*, vol. 64, pp. 189–193, 1986.
C. W. Chu et al., "Evidence for Superconductivity above 40 K in the La–Ba–Cu–O Compound System", *Physical Review Letters*, vol. 53, No. 4, pp. 405–407, Jan. 1987.
C. W. Chuet al., "Superconductivity at 52.5 K in the Lanthanum–Barium–Copper–Oxide System", *Science Reports*, vol. 235, pp. 567–569, Jan. 1987.
R. J. Cava et al., "Bulk Superconductivity at 36 K in $La_{1.8}Sr_{0.2}CuO_4$", *Physcial Review Letters*, vol. 58, No. 4, pp. 408–410, Jan. 1987.
J. M. Tarascon et al., "Superconductivity at 40 K in the Oxygen–Defect Perovskites $La_{2-x}Sr_xCuO_{4-y}$", *Science Reports*, vol. 235, pp. 1373–1376, Mar. 13, 1987.
M. K. Wu et al., "Superconductivity at 93 K in a New Mixed–Phase Y–Ba–Cu–O Compound System at Ambient Pressure", *Physcial Review Letters*, vol. 58, No. 9, pp. 908–910, Mar. 2, 1987.
Superconduction, Stripline Resonator Performance, McAvoy et al., IEEE Tran. Magn., May 25, 1989.
Applied Physics Letters, Perlow et al., 33(12) Dec. 1978, Howard-Refractory Lift Off Process.

*Primary Examiner*—Patrick Ryan
*Attorney, Agent, or Firm*—Carl O. Thomas

[57] ABSTRACT

A patterned crystalline superconducting layer is formed by first providing a copper oxide lift-off layer under an amorphous metal oxide superconducing precursor layer and then photolithographically forming a pattern in the layers. The patterned layers are then heat treated to form the final crystalline superconducting layer.

32 Claims, 2 Drawing Sheets

CONDUCTIVE ARTICLES AND PROCESSES FOR THEIR PREPARATION

FIELD OF THE INVENTION

The present invention relates to articles having patterned conductive coatings, to processes for preparing these articles, and to useful intermediate articles. In certain preferred forms this invention relates to articles having patterned superconductive coatings and processes for their preparation.

BACKGROUND OF THE INVENTION

The term "superconductivity" is applied to the phenomenon of immeasurably low electrical resistance exhibited by materials. Until recently superconductivity had been reproducibly demonstrated only at temperatures near absolute zero. As a material capable of exhibiting superconductivity is cooled, a temperature is reached at which resistivity decreases (conductivity increases) markedly as a function of further decrease in temperature. This is referred to as the superconducting transition temperature or, in the context of superconductivity investigations, simply as the critical temperature ($T_c$). $T_c$ provides a conveniently identified and generally accepted reference point for marking the onset of superconductivity and providing temperature rankings of superconductivity in differing materials. The highest temperature at which superconductivity (i.e., zero resistance) can be measured in a material is referred to as $T_o$.

It has been recently recognized that certain rare earth alkaline earth copper oxides exhibit superconducting transition temperatures well in excess of the highest previously known metal oxide $T_c$, a 13.7° K. $T_c$ reported for lithium titanium oxide. Some heavy pnictide mixed alkaline earth copper oxides also exhibit superconducting transition temperatures well in excess of the highest previously accepted reproducible $T_c$, 23.3° for the metal Nb$_3$Ge.

Recent discoveries of higher superconducting transition temperatures in rare earth alkaline earth copper oxides are reported in the following publications:

P-1 J. G. Bednorz and K. A. Miller, "Possible High $T_c$ Superconductivity in the Ba-La-Cu-O System", *Z. Phys. B.—Condensed Matter*, Vol. 64, pp. 189-193 (1986) revealed that polycrystalline compositions of the formula Ba$_x$La$_{5-x}$Cu$_5$O$_{5(3-y)}$, where x=1 and 0.75 and y>0 exhibited superconducing transition temperatures in the 30° K. range.

P-2 C. W. Chu, P. H. Hor, R. L. Meng, L. Gao, Z. J. Huang, and Y. Q. Wang, "Evidence for Superconductivity above 40 K. in the La-Ba-Cu-O Compound System", *Physical Review Letters*, Vol. 53, No. 4, pp. 405-407, Jan. 1987, reported increasing $T_c$ to 40.2° K. at a pressure of 13 kbar. At the end of this article it is stated that M. K. Wu increased $T_c$ to 42° K. at ambient pressure by replacing Ba with Sr.

P-3 C. W. Chu, P. Hor, R. L. Meng, L. Gao, and Z. J. Huang, "Superconductivity at 52.5 K. in the Lanthanum-Barium-Copper-Oxide System", *Science Reports*, Vol. 235, pp. 567-569, Jan. 1987, a $T_c$ of 52.5° K. for (La$_{0.9}$Ba$_{0.1}$)$_2$CuO$_{4-y}$ at high pressures.

P-4 R. J. Cava, R. B. vanDover, B. Batlog, and E. A. Rietman, "Bulk Superconductivity at 36 K. in La$_{1.8}$Sr$_{0.2}$CuO$_4$", *Physical Review Letters*, Vol. 58, No. 4, pp. 408-410, Jan. 1987, reported resistivity and magnetic susceptibility measurements in La$_{2-x}$Sr$_x$CuO$_4$, with a $T_c$ at 36.2° K. when x=0.2.

P-5 J. M. Tarascon, L. H. Greene, W. R. McKinnon, G. W. Hull, and T. H. Geballe, "Superconductivity at 40 K. in the Oxygen-Defect Perovskites La$_{2-x}$Sr$_x$CuO$_{4-y}$", *Science Reports*, Vol. 235, pp. 1373-1376, Mar. 13, 1987, reported title compounds (0.05 ≦ X ≦ 1.1) with a maximum $T_c$ of 39.3° K.

P-6 M. K. Wu, J. R. Ashburn, C. J. Torng, P. H. Hor, R. L. Meng, L. Geo, Z. J. Huang, Y. Q. Wang, and C. W. Chu, "Super-conductivity at 93 K. in a New Mixed-Phase Y-Ba-Cu-O Compound System at Ambient Pressure", *Physical Review Letters1*, Vol. 58, No. 9, PP. 908-910, Mar. 2, 1987, reported stable and reproducible superconducting transition temperatures between 80° and 93° K. at ambient pressure for materials generically represented by the formula (L$_{1-x}$M$_x$)$_a$A$_b$D$_y$, where L=Y, M=Ba, A=Cu, D=0, x=0.4, a=2, b=1, and y≦4.

More recent publications have reported high temperature superconductivity in bismuth mixed alkaline earth copper oxides, thallium mixed alkaline earth copper oxides and bismuth barium alkali metal oxides.

The experimental details provided in publications P-1 through P-6 indicate that the rare earth alkaline earth copper oxides prepared and investigated were in the form of cylindrical pellets produced by forming a mixed oxide by firing, grinding or otherwise pulverizing the amorphous oxide, compressing the particulate mixed oxide formed into cylindrical pellets, and then sintering to produce a polycrystalline pellet. While cylindrical pellets are convenient articles for cooling and applying resistance measuring electrodes, both the pellets and their preparation procedure offer significant disadvantages to producing useful electrically conductive articles, particularly articles which exhibit high conductivity below ambient temperature—e.g., superconducting articles. First, the step of grinding or pulverzing the mixed oxide on a commercial scale prior to sintering is both time and energy consuming and inherently susceptible to material degradation due to physical stress on the material itself, erosion of grinding machinery metal, and handling. Second, electrically conductive articles rarely take the form of pellets. Electrically conductive articles most commonly take the form of flexible elongated conductive articles—e.g., wires, and articles forming conductive pathways on a substrate, such as insulative and semiconductive substrates—e.g., printed and integrated circuits.

RELATED COMMONLY ASSIGNED CO-PENDING APPLICATIONS

Mir et al U.S. Ser. No. 46,593, filed May 4, 1987, titled now U.S. Pat. No. 4,880,770 now allowed, discloses articles containing an eletrically conductive rare earth alkaline earth copper oxide layer and processes for their preparation.

Strom et al U.S. Ser. No. 68,391, filed July 1, 1987, titled CONDUCTIVE THICK FILMS AND PROCESSES FOR FILM PREPARATION, now allowed, articles containing an electrically conductive rare earth alkaline earth copper oxide layer having at thickness of at least 5 um and processes for their preparation.

Agostinelli et al U.S. Ser. No. 85,047, filed Aug. 13, 1987, titled BARRIER LAYER CONTAINING CONDUCTIVE ARTICLES now abandoned in favor of U.S. Ser. No. 330,409, filed Mar. 30, 1989, discloses articles as described above including a barrier layer interposed between the substrate and conductive layer containing a metal in its elemental form or in the form of an oxide or silicide chosen from the group consisting of magnesium, a group 4 metal, or a platinum group metal.

Hung et al U.S. Ser. No 153,699, filed Feb. 8, 1988, titled BARRIER LAYER ARRANGEMENT FOR CONDUCTIVE LAYERS ON SILICON SUBSTRATES, now allowed, discloses articles having a silicon substrate and a conductive layer as described above additionally including a barrier layer triad consisting of silica as a first layer, a group 4 metal oxide as a third layer, and a second layer interposed between the first and third layers of mixed composition.

Agostinelli, el al, U.S. Ser. No. 172,926, filed Mar. 25, 1988 titled CONDUCTIVE ARTICLES AND PROCESSES FOR THEIR PREPARATION now abandoned in favor of continuation-in-part U.S. Ser. No.214,976, filed July 5, 1988, which has been in turn abandoned in favor of continuation U.S. Ser. No. 359,306, filed May 31, 1989, discloses articles as described above wherein the conductive layers are of a crystalline heavy pnictide mixed alkaline earth copper oxide.

PRIOR ART DEFICIENCIES AND PROBLEMS

The new high $T_c$ superconductors described above have great potential in the area of thin and thick film devices. The fabrication of such devices requires the ability to achieve high quality patterned thin films. A simple and common method to achieve patterning, particularly in thin films, employs photoresist patterning and chemical etching techniques.

One problem in manufacturing articles which have a patterned film of any of the aforementioned ceramic conductors on a subtrate is the difficulty in uniformly developing the desired pattern without leaving oxide residues between conductors. This problem appears to arise due to the different etch rates of the various metal oxides making up the conducting ceramic composition. No etch has been found which completely removes all of the oxides without leaving an undesirable residue of some kind in the areas which are intended to be completely etched away.

SUMMARY OF THE INVENTION

In one aspect, this invention is directed to an article comprised of a substrate and an electrically conductive crystalline mixed metal oxide layer having a thickness of no more than about 2 um located on the substrate, characterized in that a readily etchable, non-contaminating lift-off layer is interposed between the conductive layer and the substrate. The term "lift off" refers to a mechanism wherein removal of an underlying layer by chemical etching causes removal of material present over that layer.

In a more specific aspect this invention is directed to a process comprising applying to a substrate, metal oxide precursors and thermally decomposing the precursors. The precursors are such that when appropriately heat treated a mixed metal oxide film is formed which, when fired at high temperature, converts to a conductive crystalline metal oxide layer. The process is characterized in that prior to applying the metal oxide precursors to the substrate, the substrate is coated with a readily etchable lift-off layer which will not contaminate the final conductive crystalline layer to be formed on the substrate.

In another aspect, this invention is directed to a process employing the lift-off layer for forming a circuit pattern of conductive crystalline metal oxide on a substrate.

The present invention makes available to the art articles containing a patterned electrically conductive mixed metal oxide layer which is capable of being patterned by photoresist/chemical etching techniques in a manner which essentially eliminates the formation of undesirable residues on the patterned substrate. Further, these articles are capable of being fabricated in any of the most commonly employed geometrical forms of electrically conductive elements and may be provided in the form of elongated articles, such as elongated flexible articles employed for the fabrication of leads and windings in electrical circuits as well as electrically conductive articles exhibiting circuit patterns—e.g., printed, hybrid, and integrated circuits. The present invention also makes available to the art unique thin film elements.

Additionally the present invention makes available to the art intermediate articles which can be further fabricated by subsequent fabricators to satisfy specific circuit applications. That is, the present invention makes available intermediate articles which can be processed further to produce desired circuitry of patterns by photoresist/chemical etching techniques well known in the art which are free of undesirable residues.

While the process described herein is generic in that it is not limited in use to any particular mixed metal oxide conductive film, in its preferred form, it is particularly suitable for use with cuprates, e.g., rare earth-alkaline earth cuprates and heavy pnictide alkaline earth cuprates wherein copper oxide is the lift-off layer. The term "cup-rate" refers to mixed metal oxide crystalline conductive compounds which include copper as a component thereof. The term is used to differentiate the crystalline compound from that of a mere mixture of oxides of the different metals employed as a precursor for forming the compound.

BRIEF DESCRIPTION OF THE DRAWINGS

These and other advantages of the invention can be better appreciated by reference to the following detailed description of preferred embodiments considered in conjunction with the drawings, in which.

DESCRIPTION OF PREFERRED EMBODIMENTS

Figure 1:
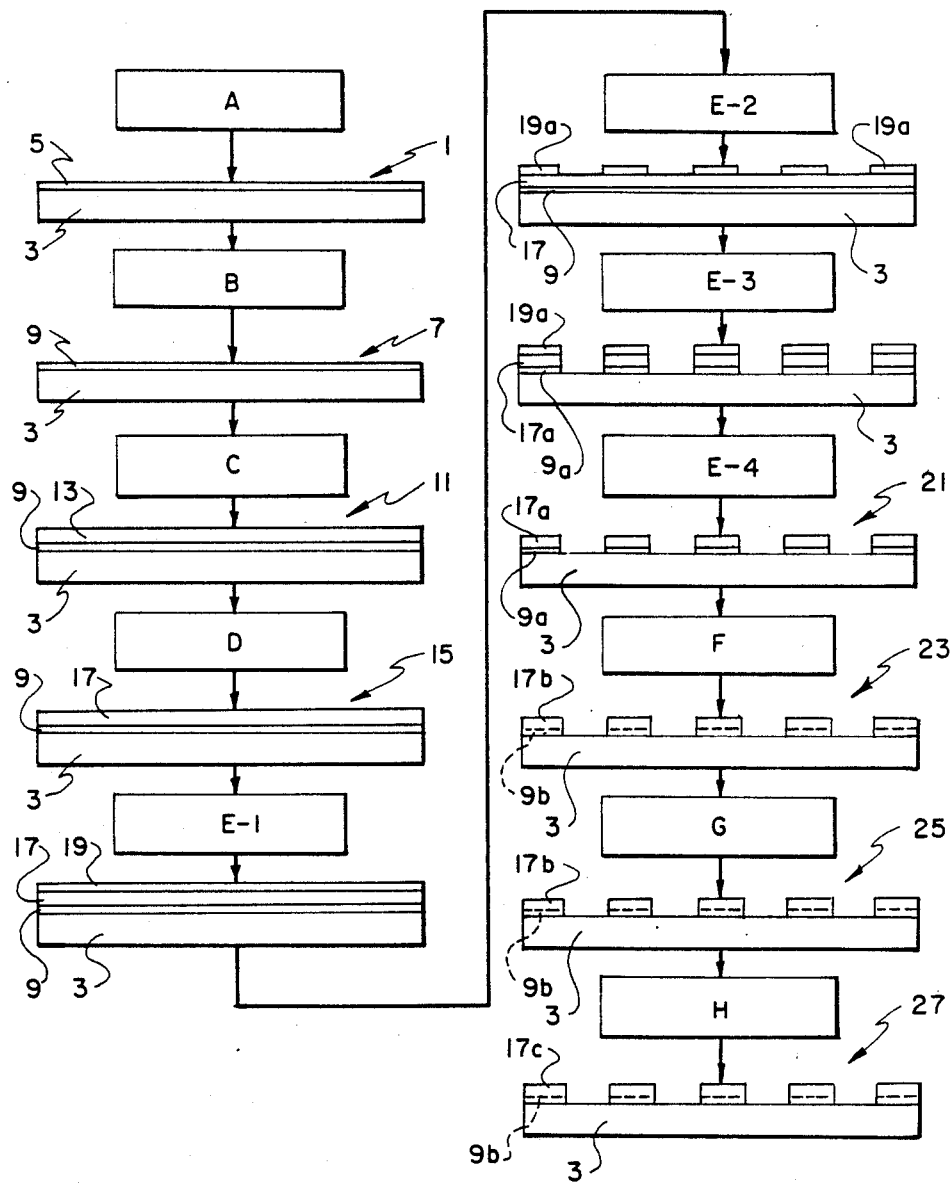
FIG. 1 is schematic diagram showing process steps and articles produced thereby.

The present invention has as its purpose to make available electrically conductive articles comprising a thin film of a patterned conductive mixed metal oxide compound on a substrate which flim is free of undesirable oxide residues between pattern conductors.

The term "readily etchable," as it relates to the lift-off layer, refers to a layer material which can be etched at a rate which is in the same order of magnitude as the most readily etchable component of the amorphous mixed metal oxide layer formed thereover, preferably with the same etchant. By providing such an underlying layer, the less readily etchable oxides which otherwise tend to be left as a residue on the substrate are removed due to undercutting of these residues and removal of the underlying lift-off layer to which they were adhered.

The term "non-contaminating," as it relates to the lift-off layer, refers to the fact that the element or elements making up such layer do not cause any significant degradation of the conducting or superconducting properties of the final overlying conductive film, e.g., does not result in a decrease of $T_c$. In order to accomplish this, it is preferred to employ a lift-off layer which comprises a component of the final conductive mixed metal oxide film. For presently known ceramic oxide conductive films, e.g., the rare earth-alkaline earth cuprates and the heavy pnictinic-alkaline earth cuprate composition, copper oxide is the most readily etchable component, and hence a copper or copper oxide lift off layer is preferred since such a lift-off material does not add any new element to the conductive film upon crystallization. Further, the composition of the precursor mixed oxide film used to form the cuprate film can be adjusted to compensate for any migration of copper ions from the underlying lift-off layer into the bulk of the conductive crystalline film.

While a copper or copper oxide lift-off layer is preferred for the above mentioned cuprate type ceramic compositions it should be understood that one can use an alkaline earth oxide lift-off layer as alkaline earth oxides are generally readily soluble in various acidic solutions and complexing agents which can also etch the other components of the film.

It is important to distinguish the novel lift-off layer from the prior art barrier layers as disclosed in Agostinelli, et al, Ser. No. 085,047, cited above. The function of the barrier layer is to prevent migration of ionic contaminants from the substrate into the conductive film and not to provide a means for preventing oxide residue formation. In fact, the barrier layers proposed in the aforementioned application do not lend themselves for use as a lift-off layer and vice versa. Further, it is contemplated in one embodiment of the present invention that a barrier layer be provided on the substrate prior to providing the lift-off layer thereon. Further, the optimal thichness of a barrier layer is generally in excess of 5,000 Å while the optimal thickness of a lift-off layer is generally less than 1,000 Å.

The invention will be described in terms of an article having a heavy pnictide mixed alkaline earth copper oxide conductive layer or a rare earth-alkaline earth-copper oxide conductive layer. Further, it will be understood that other similar conductive layers can be substituted for the above mentioned layers, e.g., thallium mixed alkaline earth cup-rates.

The term "heavy pnictide mixed alkaline earth copper oxide" refers to a composition of matter containing at least one heavy pnictide element, at least two alkaline earth elements, copper, and oxgen. The term "heavy pnictide" is employed to designate Group 15 elements having an atomic number of at least 51—i.e., bismuth and antimony. Generally, the predominant pnictide is bismuth. Antimony, if present at all, is included in an amount which typically does not exceed 5 mole precent relative to bismuth. The term "alkaline earth" indicates elements of Group 2. Calcium, strontium and barium are preferred alkaline earth elements for the practice of this invention. The term "rare earth" is employed to designate yttrium and lanthanides, i.e., elements of the lanthanides series. La, Sm, Eu, Gd, Dy, Ho, Er and Yt being preferred lanthanides. References to Groups 2 and 15 are based on the Periodic Table of elements as adopted by the American Chemical Society.

In keeping with the established practice in the ceramics art of shortening lengthy chemical names of mixed metal oxides by substituting acronyms based on the first letters of the metals present, the term "PAC" is hereinafter employed to indicate generically heavy pnictide mixed alkaline earth copper oxides. The term "RAC" is employed to indicate rare earth alkaline earth copper oxide layers. When it is intended to designate specifically the heavy pnictide, rare earth or alkaline earth component specifically, the chemical symbol or symbols are substituted for P, R and/or A.

Except as otherwise noted, all steps in the preparation of electrically conductive articles according to this invention are understood to be practicable in air at atmospheric pressure. It is, of course, recognized that increasing the proportion of ambient oxygen present and operation at elevated pressures, used separately or together, is generally compatible with the practice of this invention and can be employed although not required. As compared to rare earth alkaline earth copper oxides, the heavy pnictide mixed alkaline earth copper oxides appear to be relatively insensitive to variations in ambient oxygen levels.

The present invention can be appreciated by the schematic diagram shown in FIG. 1. In Step A of the preparation process, onto a substrate is coated a solution consisting essentially of a volatilizable film forming solvent and a metal-ligand compound of the metal component of the lift-off layer, the ligand being thermally volatilizable (i.e., they decompose leaving an inorganic film). The resulting coated article 1 as schematically shown consists of a substrate 3 and a layer 5 formed by the metal-ligand lift-off layer precursor and film forming solvent.

In Step B article 1 is heated to a temperature sufficient to volatilize the ligands and the film forming solvent. The element 7 resulting consists of substrate 3 and lift-off layer 9.

In Step C of the preparation process, onto the lift-off layer is coated a solution consisting essentially of a volatilizable film forming solvent and metal-ligand PAC and/or RAC precursor compounds of e.g., metal ligand compounds of each of heavy pnictide, at least two different alkaline earth elements, and copper containing at least one thermally volatilizable ligand; or a rare earth, alkaline earth and copper containing ligand. The resulting coated article 11 as schematically shown consists of substrate 3, the lift-off layer 9 and a layer 13 formed by PAC and/or RAC precursors (metal-ligand compounds) and film forming solvent. For convenience, the remainder of the process shall be described in terms of PAC layers although it is equally applicable to RAC layers or other thin film patterned conductive layers.

In Step D article 11 is heated to a temperature sufficient to volatilize the PAC precursor ligands and the film forming solvent. The element 15 resulting consists of substrate 3, lift-off layer 9 and mixed PAC oxide layer 17. In its mixed oxide form the PAC coating is generally substantially amorphous and exhibit relatively low levels of electrical conductivity.

To form a desired pattern, the element 15 is processed in accordance with well known photoresist/chemical etching techniques. The mixed PAC oxide layer lends itself to precise pattern definition and produces results generally superior to those achieved by patterning the PAC precursor layer from which it is formed or the conductive crystalline PAC compound layer which is produced by further processing. The PAC precursor layer is often liquid before performing process Step D and is in all instances softer and more easily damaged in handling than the amorphous PAC layer. The crystalline PAC layer cannot be etched with the same boundary precision as the mixed PAC oxide layer, since etch rates vary from point to point based on local variations in the crystal faces and boundaries presented to the etchant.

While the mixed PAC oxide layer can be patterned employing any conventional approach for patterning metal oxides, for more precise edge definitions the preferred approach is to photo pattern the mixed PAC oxide layer employing any of the photoresist compositions conventionally employed for the precise definition of printed circuit or integrated circuit conductive layers. In a preferred form of the process, a uniform photoresist layer 19 is applied to the mixed PAC oxide layer 17 as indicated by process Step E-1. The photoresist layer can be formed by applying a liquid photoresist composition to the substrate, spinning the substrate to insure uniformity of the coating, and drying the photoresist. Another approach is to laminate a preformed photoresist layer supported on a transparent film to the mixed PAC oxide layer.

The photoresist layer is then image wise exposed to radiation, usually through a mask. The photoresist can then be removed selectively as a function of exposure by development. Positive working photoresists are removed on development from areas which are exposed to imaging radiation while negative working photoresists are removed only in areas which are not exposed to imaging radiation. Exposure and development are indicated by process Step E-2. Following this step patterned photoresist layer 19a is left on a portion or portions of the mixed PAC oxide layer 17. Although the patterned residual photoresist layer is for convenience shown of a simple geometrical form, it is appreciated that in practice the patterned photoresist can take any of a wide variety of geometrical forms, including intricate and thin line width patterns, with line widths ranging into the micrometer range.

Following patterning of the photoresist layer, portions of the PAC layer which are not protected by the photoresist can be selectively removed by etching, as indicated by process Step E-3. This converts the continuous mixed PAC oxide layer 17 to a patterned PAC layer 17a in a patterned lift-off layer 9a confined to areas corresponding to that of the photoresist. The etchant etches the PAC oxides at different rates which normally tends to leave an undesired oxide residue. However, removal of the underlying lift-off layer due to undercutting leaves these oxides without any substantial bond to the substrate and easily removable upon simple rinsing. The rinsing step can optionally utilize ultrasonic rinsing in either aqueous or organic media.

Following the patterning of the mixed PAC oxide layer the patterned photoresist is removed, as indicated by process Step E-4. The resulting article 21 as shown in FIG. 1 consisting of the substrate 3 and patterned lift-off layer 9a, and patterned mixed PAC oxide layer 17a is then further processed as indicated in the figure with process Step F. In the process of preparing a patterned article described above it is noted that once an article is formed having a mixed PAC or RAC oxide layer over a lift-off layer on a substrate it can be patterned to serve any of a wide variety of circuit applications, depending upon the circuit pattern chosen. It is therefore recognized that instead of or as an alternative to offering patterned articles for sale, a manufacturer can instead elect to sell articles with unpatterned mixed PAC or RAC oxide layers over a lift-off layer, with or without an unpatterned photoresist layer, to subsequent fabricators. It will often be convenient in this instance to locate a removable layer or film over the mixed PAC or RAC oxide layer for its protection prior to further fabrication. The subsequent fabricator can undertake the patterned exposure and further processing required to produce a finished electrically conductive article.

To convert the mixed PAC oxide layer to a more highly conductive form by inducing compound formation and crystal growth of the PAC layer, in Step F the article 21 is heated to a temperature sufficient to convert the mixed PAC oxide layer to a more electrically conductive crystalline cuprate compound form. In article 23 the PAC layer 17b on substrate 3 is a crystalline compound. Depending upon the times and temperatures employed and the thickness of the lift-off layer 9a the lift-off layer may be partially or totally incorporated into the PAC layer 17b and is therefore shown as a dotted line and designated as 9b.

When the layer is slowly heated, crystallization of the PAC layer occurs in two stages—crystal nucleation and crystal growth. It is, in some instances, preferred to achieve crystal nucleation at a somewhat different temperature than is employed for crystal growth. Further heating of the PAC layer at the temperature of nucleation or, preferably, at a somewhat higher temperature increases the size of the crystal nuclei until facets of adjacent crystals are grown into electrically conductive juxtaposition.

According to accepted percolation theory, for a layer consisting of conducting spheres located in a surrounding nonconducting medium the spheres must account for at least 45 percent by volume of the layer for satisfactory electrical conductivity to be realized. If conducting particles of other geometric forms, particularly elongated forms, are substituted for the spheres, the conducting particles can account for less of the layer volume while still realizing satisfactory layer electrical conductivity. Similarly, electrical conductivity can be realized with a lesser proportion of conducting particles when the surrounding medium is also conductive. In the conductive PAC or RAC compound layers of the present invention, the geometrical form of the conductive crystals is such that electrical conductivity is realized when these crystals form substantially less than 45 percent by volume of the layer. Satisfactory electrical conductivity is observed when the conductive crystalline phase forms only 30 percent or less by volume of the layer. However, it is generally preferred that the conductive crystalline phase form at least 70 percent, optimally at least 90 percent, by volume of the total PAC or RAC layer.

To achieve compound formation and crystal growth the mixed PAC or RAC oxide layer can be heated to any convenient temperature level. In general, satisfactory crystallization of the PAC layer can be achieved at lower temperatures than have been suggested for the crystallization of RAC layers. Crystallization is contemplated at temperatures below those which result in volatilization of heavy pnictide oxide. To avoid interaction with less than inert substrates, it is generally preferred that heating of the PAC or RAC layer be no higher than is required for satisfactory crystallization. Heating to achieve compound formation and crystal growth can, for example, be limited to temperatures below the melting point of the PAC or RAC composition forming the layer. From microscopic examination of PAC or RAC layers optimum heating times can be selected for maximizing both the proportion of the PAC or RAC layer accounted for by the crystalline phase and the desired configuration of the crystals produced, thereby maximizing electrical conductivity.

Step G entails cooling of the PAC layer from its crystallization temperature. It is a surprising observation that PAC layer conductivities, unlike RAC layer conductivities, have been observed to be relatively independent of their cooling rates. Therefore, no particular cooling profile need be imposed on the PAC layer. In one form rapid cooling rate, e.g., direct removal from the furnace temperature to ambient room temperature is preferred. However, in processing conductive RAC films, a cooling rate of 25° C. per minute or less is contemplated until the crystalline RAC layer reaches a temperature of at least 500° C. or, preferably, 200° C. Below these temperatures the RAC lattice is sufficiently rigid that the desired crystal structure is well established. The article 25 produced is formed of the annealed crystalline PAC layer 17b on susbstrate 3.

The article 25 exhibits high levels of electrical conductivity and appears to exhibit little sensitivity to oxygen levels present during crystallization and cooling. Therefore, unlike the preparation of RAC layers, a post-crystallization oxygen treatment step is not required to achieve good electrical behavoir.

The present invention does not, however, preclude such an additional processing step, if desired. For example, an article containing both a RAC layer and a PAC layer would normally be given a post crystallization oxygen treatment to improve the conductivity of the RAC layer. Therefore, optional Step H, developed originally for RAC layers, entails heating the article 25 in an oxygen enriched atmosphere, preferably pure oxygen. The object is to equilibrate the crystalline layer with the oxygen enriched atmosphere, thereby providing sufficient oxygen into the crystal lattice structure. Temperatures for oxygen enrichment of the RAC layer are above the minimum annealing temperatures employed in Step G described above. The duration and temperature of heating are interrelated, with higher temperatures allowing shorter oxygen enrichment times to be employed. Substantially complete oxygen equilibration of the RAC layer can be realized at near minimum temperatures in about 1 hour. Generally any oxygen enrichment of the RAC layer will result in adequate incorporation in the PAC layer, if present, since the properties of the latter remain surprisingly invariant with alterations in oxygen availability.

In preparing layers shown to be benefitted by oxygen enrichment of the ambient atmosphere Step H can be consolidated with either or both of Steps F and G. Oxygen enrichment is particularly compatible with Step G, allowing annealing out of crystal lattice detects and correction of crystal lattice oxygen deficiencies to proceed concurrently.

The final electrically conductive article 27 is comprised of a crystalline, electrically conductive PAC or RAC layer 17c on substrate 3. Depending upon the thickness of the lift-off layer and the processing times and temperatures, some or all of the lift-off layer 9b may be incorporated as part of the crystalline layer. Also, depending upon specific choices of materials and preparation techniques, the article 17c can exhibit a high superconducting transition temperature, herein employed to designate a $T_c$ of greater than 30° K.

While the process as described above is in terms of providing the various layers (lift-off layer and PAC or RAC layers) by thermal volatilization of metal-ligand solutions, it should be understood that the present invention is not limited to any particular method of providing these layers. For example, a lift-off layer—e.g., a copper oxide lift-off layer, can be formed on a substrate by reactive sputtering, chemical vapor phase deposition, electroless copper deposition or vacuum evaporation of copper followed by anodization or heat treatment of the copper layer in oxygen. Likewise, although not preferred, the PAC or RAC layers can be formed by similar techniques which are well known in the art.

The present invention lends itself readily to the preparation of elongated electrically conductive articles, particularly flexible elongated electrically conductive articles.

A coating process particularly adapted to coating flexible substrates can be illustrated by reference to FIG. 2, wherein an elongated flexible substrate 35 is unwound from a supply spool 37 and passed downwardly over a guide roller 39 into a first reservoir 41. The reservoir contains a film forming solvent with a metal-ligand lift-off layer precursor compound dissolved therein, as described above in connection with Step A, shown as a liquid body 43. The flexible substrate is drawn over a lower guide roller 45 while immersed in the liquid and then passed upwardly to a third guide roller 47.

As the flexible substrate is drawn upwardly it emerges from the liquid body bearing an annular thin, uniform surface layer corresponding to layer 5 in FIG. 1. Between the reservoir and the third guide roller the coated substrate is drawn through a first heating zone 48 to form an adherent lift-off coating on the substrate described above in connection with Step B. Thereafter, the flexible substrate 35 is passed downwardly over a fourth guide roller 49 and through a second reservoir 51 containing a film forming solvent with PAC and/or RAC precursor metal ligand-compounds dissolved therein, as described above in connection with Step C, shown as liquid body 53. The flexible, lift-off layer coated substrate is drawn over a second lower guide roller 55 while immersed in the liquid and then passed upwardly over a sixth guide roller 57. As the flexible substrate is drawn upwardly it emerges from the liquid body 53 bearing an annular thin, uniform surface layer corresponding to layer 13 in FIG. 1. Between the second reservoir 51 and the sixth guide roller 57 the coated substrate is drawn through a second heating zone 58 to volatilize the ligands leaving a mixed PAC or RAC oxide layer on the lift-off layer. Thereafter, the flexible substrate may be rolled on a roller (not shown) and stored or sold for further later processing or it may be continuously processed, as shown, to form a pattern as described above in Steps E1 to E4 of FIG. 1. Thereafter, the patterned substrate is treated in a third heating zone to complete in different regions of the heating zone process Steps F through H sequentially, as previously described. To accommodate needs for different residence times within the various heating regions the lengths of the different regions can be adjusted. Additionally, residence time of a substrate within any heating region can be further increased by employing laterally diverting guides, so one or a number of coated substrate festoon-like path diversions are created within the heating region.

After passing over a final guide roller 59 the substrate, bearing an annular crystalline electrically conductive PAC or RAC compound layer is wound onto a storage spool 61. Where the conductive layer is coated on a flexible substrate, it is preferred to maintain the thickness of the layer at 2 $\mu$m or less, preferably 1.0 $\mu$m or less, so that it exhibits adequate flexibility. Flexing of the conductive layer required by guiding and spooling by can be reduced by increasing the radius of curvature imposed by the third guide roller and storage spool.

Figure 2:
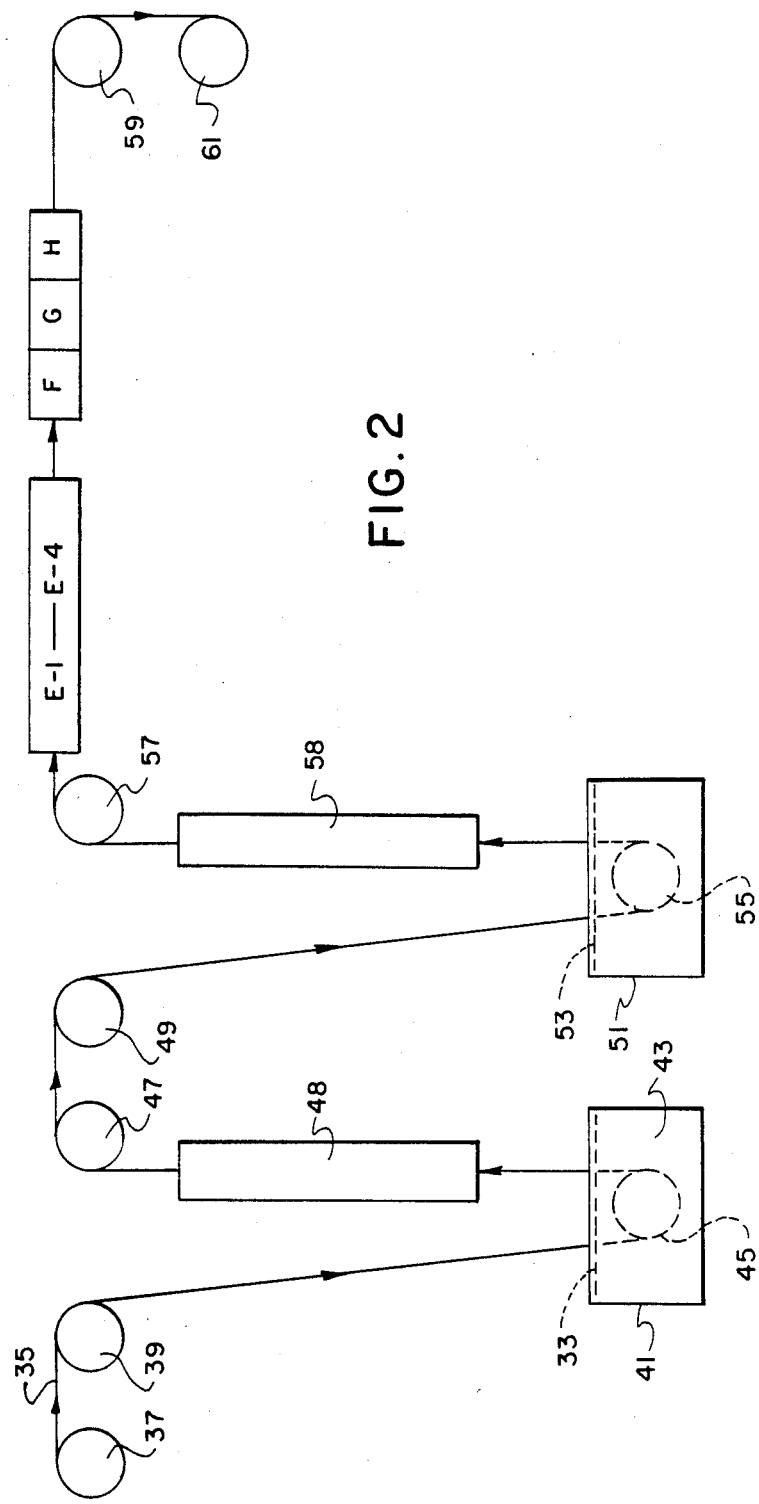
FIG. 2 is a schematic diagram of an arrangement for coating an elongated flexible substrate.

The arrangement shown in FIG. 2 for applying a flexible PAC or RAC layer to a flexible substrate is, of course, merely illustrative of a number of approaches which can be employed to apply a PAC or RAC layer to a flexible substrate. Where it is more convenient to perform the process steps in a horizontally offset rather than vertically offset spatial relationship, instead of applying the precursors and film forming solvent by immersion of the substrate, other conventional coating approaches can be employed for application, such as roll coating, spraying, brushing, curtain coating, extrusion, or the like. It is generally preferred to avoid guide contact of the coated substrate between application of the precursors and completion of the mixed oxide film forming steps. However, once a solid layer exists on the substrate, guide contact with the substrate within or between any one of the process Step locations can be undertaken, as desired for convenient spatial orientation.

While flexible electrical conductors of extended length serve a variety of important applications, there are many other applications for electrical conductors, particularly those located on limited portions of substantially planar surfaces of substrates. Such applications include those served by conventional printed, integrated, and hybrid circuits. In such circuits limited, if any, flexibility of the electrical conductor is required, but an ability to define a patterned electrical conductor with a high degree of precision is in many instances of the utmost importance. The present invention is compatible with precise patterning of the electrical conductor on a substrate surface.

To crystallize a mixed oxide layer, i.e., to form the conductive compound and achieve crystal growth thereof, the substrate and layer are heated uniformly. This step will in most instances itself provide all of the annealing and oxygen enrichment required by the layer. Heating can be accomplished employing any conventional oven. In some instances, however, either to protect the substrate from rising to the peak temperatures encountered by the layer or simply to avoid the investment in an oven by fabricator, it is contemplated that the layer will be selectively heated. This can be accomplished by employing a radiant heat source, such as a lamp—e.g., a quartz lamp. Lamps of this type are commercially available for achieving rapid thermal annealing of various conventional layers and can be readily applied to the practice of the invention. These lamps rapidly transmit high levels of electromagnetic energy to the PAC layer, allowing it to be brought to its crystallization temperature without placing the substrate in an oven.

To avoid coating imperfections the thickness of a mixed PAC or RAC oxide layer produced in a single process sequence is maintained at 1.5 $\mu$m or less, preferably about 1 $\mu$m for a PAC layer and 0.6 $\mu$m or less, and optimally 0.4 $\mu$m or less for a RAC layer, a single process sequence being understood to constitute the steps described above for forming a mixed PAC or RAC oxide layer. By repeating the process sequence one or more times a mixed oxide layer of any desired thickness can be built up.

While ideal substrates are those which remain chemically nonreactive during fabrication of the conductive crystalline layer, in practice when conductive compound formation and crystal growth temperatures are encountered by the substrate at least some interaction of the crystallizing layer tends to occur with all but the most stable of substrates. In some instances less than hoped for levels of electrical conductivity have been observed, believed to be attributable to interaction of the crystallized layer with its substrate at their mutual interface. Unwanted reductions in $T_c$ an zero resistivity temperatures are believed to be manifestations of substrate interaction with the crystalline layer. While the presence of a lift-off layer comprising a metal oxide which is a component of the mixed oxide film which forms the crystalline layer on heating may tend to somewhat reduce this problem, the lift-off layer is not generally of a thickness, density or composition to act as a good barrier to such interaction.

To minimize unwanted interaction of the crystalline layer with the substrate it is specifically contemplated to interpose a barrier between the substrate and the crystalline layer as described in U.S. patent application Ser. No. 085,047 filed Aug. 13, 1987 and Ser. No. 153,699 filed Feb. 8, 1988, or otherwise. It has been observed that each time the process sequence required for forming the mixed oxide layer is repeated before proceeding on to the crystallization step of the process, substrate (or barrier) interaction with the crystalline layer is reduced, as reflected in its electrical conductivity properties. In this instance the portion of the crystalline layer adjacent the substrate is acting as a barrier protecting the portion of the crystalline layer remote from the substrate.

An alternative is to interpose between the substrate and the crystalline layer a barrier of a different composition, as described in U.S. patent application Ser. No. 085,047 filed Aug. 13, 1987 and Ser. No. 153,699 filed Feb. 8, 1988, or otherwise. The interposed barrier layer can itself take the form of a crystalline layer, differing from the specific conductive PAC or RAC composition chosen. In this instance the barrier layer can be viewed as a second crystalline layer, which can, if desired, perform electrical conduction as well as acting as a barrier. However, it has been found that preferred barrier layers are not polycrystalline. In other instances the barrier can be viewed as an extension of the substrate. For example, a ceramic substrate coated with a thin refractory metal layer or a semiconductor substrate coated with an oxide or nitride, each of which are in turn overcoated with the desired conductive crystalline layer, can be viewed as an article having a composite substrate supporting a conductive crystalline layer or an article having a unitary substrate, a conductive crystalline layer, and an interposed barrier. In any of the above the lift-off layer may or may not remain as a discernable layer under the patterned crystalline layer and over the barrier layer. The presence of the lift-off layer as a discernable layer will depend upon its initial thickness and the rate it may react with and become part of the crystalline layer upon processing of the mixed oxide layer to form the crystalline layer.

It is specifically contemplated to interpose a first RAC layer as a barrier layer between a lift-off layer having a second RAC layer thereover and the substrate. The RAC layers can be formed as taught by Mir et al, cited above. The preferred stoichiometry for the second RAC layer is that which produces a $R_1A_2C_3$ ratio of elements, although any other RAC stoichiometry reported to exhibit high $T_c$ properties can be substituted. Yttrium is the preferred rare earth while barium, optionally in combination with strontium or calcium, is the preferred alkaline earth for forming the second RAC layer.

One specifically contemplated barrier arrangement is that disclosed by Agostinelli et al, cited above, wherein the barrier layer is interposed under the lift-off layer and the substrate contains magnesium, zirconium, or a metal such as gold, either in an elemental state or in the form of an oxide or silicide. It should be noted that such layers are not readily etchable as defined herein and therefore not suitable as a lift-off layer.

Another specifically contemplated barrier layer arrangement for silicon substrates is that disclosed by Hung et al, cited above, wherein a barrier layer triad is interposed between a conductive layer and a silicon substrate. The barrier layer triad is comprised of a first triad layer located adjacent the silicon substrate consisting essentially of silica, a third triad layer removed from the silicon substrate consisting essentially of a least one Group 4 heavy metal (i.e., zirconium or hafnium) oxide, a second triad layer interposed between the first and third triad layers consisting essentially of a mixture of silica and at least one Group 4 metal oxide.

Electrically conductive crystalline PAC and RAC and similar conductive ceramics layers, e.g., recently reported copper free composition of oxides of bismuth, potassium and barium, can be formed on a wide variety of substrates. In general any conventional electrical conductor substrate capable of withstanding processing temperatures can be employed. For example, substrates in the form of metal, ceramic and glass plates, semiconductor wafers, and the like, all possess sufficient thermal stability to accept conductive crystalline layers applied by one or more of the procedures described above.

Any heavy pnictide mixed alkaline earth copper oxide composition, rare earth alkaline earth copper oxide or other composition known to be convertible to a conductive crystalline phase can be employed in forming the coated articles of this invention. It has been observed that some combinations of substrates and mixed copper oxides are particularly attractive in exhibiting higher $T_c$ levels and higher maximum temperatures at which superconductivity is in evidence.

One specifically preferred class of high $T_c$ articles described in V are those in which a crystalline PAC layer consists of greater than 30 percent and preferably greater than 70 by volume of a heavy pnictide mixed alkaline earth copper oxide which is in a crystalline phase that satisfied the formula.

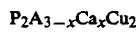

$$P_2A_{3-x}Ca_xCu_2 \quad (I)$$

where
P is bismuth optionally in combination with antimony,
A is strontium optionally in combination with barium, and
x is 0.5 to 1.5.

The formula I crystalline phase is hereinafter for convenience referred to as the $P_2A_2A'_{C2}$ crystalline phase, where A and A' represent different alkaline earth metals and C represents copper. The heavy pnictides can be a combination of bismuth and antimony, with antimony accounting for only a minor amount ($\leq 5$ mole percent) of the heavy pnictide. Optimally the heavy pnictide consists essentially of bismuth. The preferred Group 2 alkaline earths are calcium, strontium, and barium, with A preferably being strontium optionally in combination with a minor amount of barium. Optimally A consists essentially of strontium.

Preferred substrates are those which are inert toward or at least minimally interactive with the conductive crystalline layer. The preferred lift-off layer for the cuprate conductors is copper oxide. It is generally preferred to select substrates from among materials which exhibit the same or a similar crystalline form, such as a perovskite crystalline form. Also, related materials, such as lanthanum copper oxide, are suitable substrate materials. Alkaline earth oxides and alkaline earth-containing oxides (hereinafter included in the term alkaline earth oxides) constitute a particularly preferred class of substrates. They are in general relatively inert, refractory materials which exhibit limited interaction with the crystalline layers during their formation. Strontium titanate, because it can be readily formed in a perovskite crystalline form, constitutes a specifically preferred alkaline earth-containing oxide substrate material. Although some interaction between alkaline earth oxide substrate and an adjacent crystalline layer is believed to occur when the article is heated to temperatures above about 900° C., interaction effects can be minimized by employing the interposed barrier formation techniques, described above. It is generally preferred to perform the mixed oxide layer formation processing sequence three to ten times to minimize substrate interaction effects. Magnesia is another example of a specifically contemplated oxide substrate.

To facilitate formation of the most highly uniform conductive crystalline layers it is preferred that the substrate itself be monocrystalline. Monocrystalline strontium titanate and magnesia (periclase) are all readily available substrate materials. The foregoing substrates constitute preferred substrates for deposition of the layer in the absence of a barrier layer. When barrier layers are interposed between the substrate and the crystalline layer, a much broader range of substrate materials can, of course, be employed, including silica, alumina, silicon, and various metals capable of withstanding the crystallization temperatures of the PAC or RAC layer, such as the refractory metals. Oxidation of the metal substrate is generally unobjectionable.

The formation of a particular crystalline orientation in the crystalline layer can be facilitated by employing a substrate which presents a deposition surface of the same or a similar crystalline structure, such as a perovskite. A preferred orientation for increasing the current carrying capacity of a PAC layer is one in which the longest axis (hereinafter referred to as the "c axis") of the crystals is oriented substantially perpendicular to the substrate. Substrates of monocrystalline or polycrystalline magnesia, monocrystalline strontium titanate, and monocrystalline zirconia have been demonstrated to produce the desired c axis orientation. As is generally understood in the art, to facilitate formation of monocrystalline zirconia a small amount of a stabilizer, such as calcia or yttria, is incorporated. Further, zirconium generally contains appreciable quantities of hafnium. The presence of a thin lift-off layer, e.g., preferably 250,–1,000 Å will not substantially interfere with crystallographic orientation of the conductive layer with the substrate, particularly if the lift-off layer is incorporated in the conductive layer during the compound formation and crystal growth step.

In the process of fabrication of this invention the formation of the desired conductive crystalline layer begins, after formation of the lift-off layer, with the formation of a conductor precursor layer, such as layer 7 in article 1, shown in FIG. 1. By varying the relative amount of each of the compounds in the precursor layer the composition of the final layer can be controlled. However, it should be pointed out that it is not essential to form the precursor layer with the individual precursor compounds in the exact ratio found in a particular crystal structure. For example, the preferred $P_2A_2A'C_2$ crystal structure, described above, can be formed even when there is a stoichiometric excess of one or more of the elements and a correction can be made when applicable based upon the incorporation of the lift-off layer into the crystalline layer. Further, this can occur even when the ratios of the elements exactly correspond to that of another possible crystalline form, such as a $PAA'C_2$ or $PAA'C_3$. Any proportion of materials can be employed, so long as each of the required elements is present in an amount sufficient to provide at least 30 percent by volume of the desired crystalline $P_2A_2A'C_2$ phase. Generally closer matches of precursor to desired crystalline ratios of elements result in maximizing formation of the desired phase.

To form the PAC precursor layer, a solution of a film forming solvent, a heavy pnictide metal compound, at least two alkaline earth metal compounds, and a copper compound is prepared. Each of the heavy pnictide, alkaline earth, and copper compounds consists of metal ion and one or more volatilizable ligands. Similarly, to form the RAC precursor layer at least one rare earth metal compound, at least one alkaline earth metal compound and a copper compound is prepared. Each of the rare earth, alkaline earth and copper compounds consists of a metal ion and one or more volatilizable ligands. Most useful metal-ligand compounds (e.g., metalorganic compounds) thermally decompose to form metal oxides, however, some metal compounds, in particular some alkaline earth organic compounds, form metal carbonates on decomposition. Higher temperatures are then required to convert the carbonates to oxides. Consequently, the term mixed metal oxide as used herein includes compositions which may comprise one or more carbonates. A ligand oxygen atom bonded directly to a metal is often retained with the metal in the crystalline layer, although other ligand oxygen atoms are generally removed. At least 95 percent of the ligands and their component atoms other than oxygen are preferably outgassed at the temperatures of less than 600° C. On the other hand, to avoid loss of materials before or during initial coating of the metal-ligand compounds, it is preferred that the ligands exhibit limited, if any, volatility at ambient temperatures. Metal-ligand compounds having any significant volatility below their decomposition temperature are preferably avoided in the practice of this invention.

Metalorganic (including metallo-organic and organometallic) compounds, such as metal alkyls, alkoxides, $\beta$-diketone derivatives, and metal salts of organic acids—e.g., carboxylic acids, constitute preferred metal-ligand compounds for preparing precursor coatings as well as lift-off coatings. The number of carbon atoms in the organic ligand can vary over a wide range, but is typically limited to less than 30 carbon atoms to avoid unnecessarily reducing the proportion of metal ions present. Carboxylate ligands are particularly advantageous in promoting metal-ligand solubility. While very simple organic ligands, such as oxalate and acetate ligands, can be employed in one or more metal-ligands compounds, depending upon the film forming solvent and other metal-ligand compound choises, it is generally preferred to choose organic ligands containing at least 4 carbon atoms. The reason for this is to avoid crystallization of the metal-ligand compound and to improve solubility. When heating is begun to remove the film forming solvent and ligands, the solvent usually readily evaporates at temperatures well below those required to remove the ligands. This results in leaving the metal-ligand compounds on the substrate surface. When the ligands have few carbon atoms or, in some instances, linear carbon atom chains, crystallization of the metal-ligand compounds occurs. In extreme cases crystallization is observed at room temperatures. While this does not adversely affect the lift-off layer, this works against the molecular level uniformity of PAC and RAC ions sought by solution coating. Choosing organic ligands exhibiting 4 or more carbon atoms, preferably at least 6 carbon atoms, and, preferably, ligands containing branched carbon atom chains, reduces molecular spatial symmetries sufficiently to avoid crystallization. Optimally organic ligands contain from about 6 to 20 carbon atoms.

Instead of increasing the molecular bulk or modifying the chain configuration of organic ligands to avoid any propensity toward metalorganic compound crystallization on solvent removal, another technique which can be employed is to incorporate in the film forming solvent a separate compound to act as a film promoting agent, such as a higher molecular weight branched chain organic compound. This can, for example, take the form of a branched chain hydrocarbon or substituted hydrocarbon, such as terpene having from about 10 to 30 carbon atoms.

The film forming solvents can be chosen from a wide range of volatilizable liquids. The primary function of the solvent is to provide a liquid phase permitting molecular level intermixing of the metalorganic compounds chosen. The liquid is also chosen for its ability to cover the substrate uniformly. Thus, an optimum film forming solvent selection is in part determined by the substrate chosen. Generally more desirable film forming properties are observed with more viscous solvents and those which more readily wet the substrate alone, or with an incorporated wetting agent, such as a surfactant, present.

It is appreciated that a wide variety of ligands, film promoting agents, and film forming solvents are available and can be collectively present in a virtually limitless array of composition choices.

Exemplary preferred organic ligands for metal organic compounds includes metal 2-ethylhexanoates, naphthenates, neodecanoates, butoxides, isopropoxides, rosinates (e.g., abietates), cyclohexanebutyrates, and acetylacetonates, where the metal can be any of the heavy pnictide, rare earth, alkaline earth, or copper elements to be incorporated in the PAC or RAC layer respectively as well as the lift-off layer. Exemplary preferred film forming agents include 2-ethylhexanoic acid, rosin (e.g., abietic acid) ethyl lactate, 2-ethoxyethyl acetate, and pinene. Exemplary preferred film forming solvents include toluene, 2-ethylhexanoic acid, n-butyl acetate, ethyl lactate, propanol, pinene, and mineral spirits.

In some instances X-ray diffraction has revealed the presence of microcrystals in the predominantly amorphous mixed oxide layer, although limited to minor amounts, typically less than about 5 percent, based on the total volume of the layer. While crystallization of the metal-ligand compounds, which tends to separate the metals into different phases, is generally avoided, crystallization which occurs during or immediately following ligand volatilization is not objectionable, since metals absent their ligands are free to form mixed metal oxides.

The preferred lift-off layer is a copper oxide layer. Copper oxide is the most readily etchable component of the PAC and RAC layers and it does not introduce any new ions capable of contaminating the crystalline layer. Alternatively, one can use a thin metallic copper layer or an oxide or carbonate of an alkaline earth included in the PAC or RAC composition. In any event, the lift-off layer may be deposited from the metal-organic type compounds set forth above. Another suitable lift-off film is silver. Silver is etchable and does not appear to lead to undesirable contamination of the conductive films. Further, silver offers some barrier protection, albeit not complete barrier protection in the thicknesses employed as a lift-off film, e.g., <1,000 Å. Where the conductive oxide compound contains no copper but does include an alkaline earth, an alkaline earth oxide lift-off layer would be preferred to avoid contamination.

As previously noted, the metal-ligand compounds are incorporated in the film forming solvent in the proportion desired in the final crystalline layer corrected, if necessary for incorporation of the lift-off layer. The metals can each be reacted with the sample ligand forming compound or with different ligand forming compounds. The metal-ligand compounds can be incorporated in the film forming solvent in any convenient concentration up to their saturation limit at ambient temperature. Generally a concentration is chosen which provides the desired crystalline layer thickness for the process sequence. Where the geometry of the substrate permits, uniformity and thickness of the metal-ligand coating can be controlled by spinning the substrate after coating around an axis normal to the surface of the substrate which has been coated. A significant advantage of spin coating is that the thickness of the coating at the conclusion of spinning is determined by the contact angle and viscosity of the coating composition and the rate and time or spinning, all of which can be precisely controlled. Differences in the amount of the coating composition applied to the substrate are not reflected in the thickness of the final coating. Centrifugal forces generated by spinning causes excess material to be rejected peripherally from the article.

Processing temperatures employed in forming the lift-off layer and the mixed oxide layers and in subsequently converting the mixed oxide layers to conductive crystalline compound layers can vary significantly, depending upon the specific compound formation and crystal growth temperature of the PAC or RAC composition. PAC crystallization temperatures can range down to about 780° C. RAC crystallization temperatures are somewhat higher. Optimum temperatures for compound formation and crystal growth vary somewhat, depending on the ratios of the elements present. For example, for a $P_2A_2A'C_2$ ratio of elements, preferred crystallization temperatures are in the range of from 800° to 950° C., with optimum temperatures being in the range of from 850° to 920° C. With a $PAA'C_3$ ratio of elements, preferred crystallization temperatures are similar, but preferably about 810° C. With a $PAA'C_2$ ratio of elements, preferred crystallization temperatures are in the range of from 780° to 950° C., with optimum temperatures being in the range of from 800° to 880° C. Crystal nucleation is preferably undertaken at a somewhat lower temperature than crystal growth.

Unlike RAC layers (e.g., those described by Mir et al), once the crystalline PAC layer is formed, its properties are affected to a relatively small extent by their rate of cooling and the concentration of oxygen present during the cooling step. Thus, much greater flexibility is afforded in cooling and/or annealing following crystal formation. It appears that spontaneous cooling rates to ambient temperatures in air produce results generally comparable to those achieved with reduced cooling rates in an oxygen controlled atmosphere.

For RAC layers, typical compound formation and crystal growth temperatures are in the range from about 850° to 1100° C. Following conversion of the RAC layer to a $R_1A_2C_3$ crystalline phase, it is important to cool the layer slowly—e.g., at a rate of $\leq 25°$ C./min. until it reaches a temperature of 750° to 400° C. The layer is then held at this temperature or reheated to this temperature following cooling, in the presence of an oxygen atmosphere unitl oxygen equilibration is substantially complete, typically about 20 to 120 minutes.

EXAMPLES

Details of the preparation and performance of articles according to this invention are illustrated by the following examples. Example 1 and 2 represent the results of laboratory investigations. Example 3 combines the laboratory investigations for forming a copper oxide lift-off layer with laboratory results for forming a superconductive $Bi_2Sr_2CaCu_2O_{8+x}$ crystalline film in order to teach the use of the lift-off layer with a conductive PAC layer.

PRECURSORS

The following individual metallo-organic precursors, prepared as described, were employed:

CuO-lift-off. Copper di(2-ethyl hexanoate)

Mix 2.0 g solid Cu acetate with 8.0 g 2-ethylhexanoic acid. Reflux the mixture at the boiling point for 30 seconds. At this point all of the solid is in solution and carboxylate exchange has occurred. Add 2.0 g rosin and heat until all the rosin is solution. The rosin acts as a viscosity control and leveling agent particularly useful in spin coating. It also aids in the formation of denser, crack free and thicker films. Alternatively, one can accomplish these attributes by substituting bulky carboxylic acids with side chains ($C_{15-30}$), bulky alkanes ($C_{>18}$) or large esters e.g., dibutyl phthalate in place of rosin.

Bi-P1. Bismuth 2-ethylhexanoate 20.0 g Excess $Bi_2O_3$
25.0 g 2-Ethylhexanoic acid Mix the solid bismuth oxide with 2-ethylhexanoic acid and heat to approximately 120° C. Add a few drops of ammonium hydroxide (30% NH$_3$/H$_2$O) in order to speed up the reaction. After refluxing for 4 hours, filter, dry with sieves, and concentrate the liquid phase. Analysis showed 27.9% Bi$_2$O$_3$ residue (24.3% Bi) by weight.

Ca-P1. Calcium 2-ethylhexanoate

Calcium carbonate was treated with excess of 2-ethylhexanoic acid and xylene as needed at 120° C. for 18 hours. The mixture was then filtered and dried with molecular sieves. This was followed by concentration and filtration of the solution. Analysis showed a residue of 4.58% CaO (3.27% Ca) by weight.

Sr-P1. Strontium cyclohexanebutyrate

This compound is available commercially in high quality from Eastman Chemicals. It is supplied with an assay indicating a strontium concentration of 19.4% by weight for the lot which was used.

Ba-P1. Barium cyclohexanebutyrate

This compound is available commercially in high quality from Eastman Chemicals.

Cu-P1. Copper 2-ethylhexanoate

The Cu precursor was prepared by reacting copper acetate with 2-ethylhexanoic acid as follows:

React copper acetate (available from Baker, as 1766-1, 31.8% Cu by weight) with 2-ethylhexanoic acid by mixing 2.0 g Cu Acetate into 8.0 g 2-ethylhexanoic acid, and heating to the boiling point for 5 minutes in an open vessel. Add back enough 2-ethylhexanoic acid to cancel the weight lost during reaction to return to 10.0 g total solution. At this point a stable Cu precursor solution having 6.36% Cu by weight is produced.

YPC-P1. Y:Ba$_2$:Cu$_3$ 4.098 g yttrium tri (2-ethylhexanoate), 8.125 g barium di (cyclohexane butyrate) and 8.26 g copper di (2-ethylhexanoate) and 14.0 g rosin were dissolved in a solvent mixture consisting of 4.0 g toluene and 30.4 g 2-ethylhexanoic acid. The solution was refluxed for five minutes, allowed to cool to room temperature and then filtered using a 1.2 micron filter.

EXAMPLE 1

The Cu-lift-off precursor solution was spin coated onto one fourth of a 2 inch diameter sapphire substrate at 3,000 rpm for 20 seconds. A portion of the coating was swabbed clean leaving bare sapphire in that portion. The coated substrate was then heated to about 500° C. to remove the organics leaving a 700 Å thick copper oxide film as measured, after cooling, by profilometry.

An YBa$_2$Cu$_3$O$_{7-y}$ film was applied over the sapphire substrate utilizing the YBC-P1 precursor. The YBC-P1 solution was applied by two sequential spin coatings of the YBC precursor at 3000 rpm for 20 seconds followed by a 550° C. thermal decomposition and cooling after each spin coating. This produced an inorganic mixed yttrium-barium-copper oxide film having a total thickness of 9000 Å.

The resultant article includes a first region wherein the mixed YBC oxide coating overlies a copper oxide lift-off layer and a second region (where the lift-off film was swabbed away after spin coating) wherein the mixed YBC oxide coating was deposited directly on the substrate.

A portion of the coated article was then etched in a 10:1 aqueous dilution of a commercially available acidic cerium salt etch solution sold by Transene Company as TFD chromium etch. The portion of the article to be etched was dipped into the etchant for 10 seconds, removed and rinsed in a stream of distilled water. It was observed that while the mixed YBC oxide layer in the first region was completely removed, the usual problematic oxide residue (primarily Y$_2$O$_3$) is found on the second region where the mixed YBC oxide film was in direct contact with the sapphire substrate. Thus the inclusion of the copper oxide sublayer is shown to successfully eliminate the residue problem.

A subsequent heat treatment of the article at 875° C. for 5 minutes produced a conductive perovskite YBaCu$_3$O$_{7-y}$ crystalline layer in the unetched area.

EXAMPLE 2

A sapphire substrate coated with a mixed YB$_2$C$_3$ oxide layer over a copper oxide sub-layer was prepared in a manner similar to that described in Example 1 except that the copper oxide sublayer thickness was adjusted to be 250 Å by dilution of the Cu-lift-off layer precursor.

The coated article was then patterned by photoresist/chemical etching techniques using a commercially available Kodak 809 photoresist to give both 20 micron wide lines and spaces as well as 80 micron lines and 30 mircron spaces in the patterned film. The resist was spin coated to a thickness of 1.1 microns and then prebaked at 90° C. for 30 minutes. Subsequent to the prebake, the resist was exposed through a mask with an ultra violet illumination of 16 mW/cm for 18 seconds. The resist pattern was developed in a 1:10 aqueous dilution of commerically available 931 developer, sold at KTI Chemicals, Inc. The developer was maintained at 20° C. and the development time was 50 seconds. Following development, the article was rinsed with distilled water and then immersed in a 1:20 aqueous dilution of the aforementioned Transene Company Chromium Etch. Subsequently, the article was rinsed in a stream of distilled water followed by a 2 minute ultrasonic distilled water rinse to insure removal of residues. The remaining resist was then removed with acetone and the article was heat treated at 850° C. for 5 minutes. A patterned conductive crystalline YBa$_2$Cu$_3$O$_{7-y}$ perovskite film, free of residue, is formed.

The advantage of patterning the mixed oxide film rather than the conductive crystalline film formed after the high temperature treatment is threefold. First the mixed oxide film is more homogeneous in the pre-fired state. Secondly, chemical deterioration is minimized. Thirdly, the continued presence of the lift-off layer is assured.

EXAMPLE 3

The same procedure as described in Example 2 is employed for preparing a copper oxide layer is employed for forming a 250 micron copper oxide lift-off layer on a single crystal {100} oriented magnesia substrate. Thereafter, a precursor solution for Bi$_2$Sr$_2$Ca, Cu$_2$O$_{8+x}$ was prepared as described below. Mix 2.0 g of Bi-P1 with 1.43 g of Ca-P1 and 2.32 g of Cu-P1. These three solutions are miscible and form a stable solution. To this add 1.05 g Sr-P1 and heat at the boiling point to get all of the powder into solution. Some reaction has also likely occurred during this step (exchanges of carboxylate ligands). The result is a stable blue solution. To this solution add 0.5 g rosin (available from Eastman Chemicals as Rosin 2315) and heat gently to get all of the rosin in solution. Filter the solution to remove any particulate contaminants. The result is a stable solution having excellent rheological properties.

Spin-coat the above precursor solution onto single crystal MgO substrate having the CuO sublayer. Spin speed is 5000 rpm and spin time is 20 seconds.

Thermally treat the coated substrate on a hot stage in air. Ramp temperature from room temperature to 550° C. in 10 minutes. After 5 minutes at 550° C. remove sample. Repeat this process two more times to give three layers of the material.

At this point the film has a glossy appearance with a metallic luster and is essentially amorphous. Thereafter, the film is patterned in the same manner as described in Example 2.

In order to produce the patterned superconducting $Bi_2SR_2Ca, Cu_2O_{8+x}$ superconducting crystalline phase, the film is further heat treated. The film is loaded into an 865° C. box furnace, in air. After 5 minutes the film is removed. The film is now black, polycrystalline and quite conducting. It should also be highly oriented with its c axis normal to the substrate as may be evidenced by x-ray diffraction spectrometry.

Indium contacts can be applied at room temperature. A four-point ac resistance meansurement can be employed to determine the film superconducting characteristics.

The above examples are merely exemplary of the advantage and use of the lift-off layer and do not limit the scope of this invention. It is understood that this or similar lift-off layers, as previously set forth, can be employed with other superconducting film compositions e.g., the superconducting film compositions described in the previously mentioned patent applications assigned to the same common assignee as this application.

What is claimed is:

1. An article capable of forming on heating a superconducting thin film having a superconducting transition temperature of greater than 30° K. comprising a substrate capable of withstanding temperatures required to form said thin film and a mixed metal oxide layer capable of crystallizing to form said thin film on heating characterized in that a readily etchable, thin lift-off layer is interposed between said substrate and said mixed metal oxide layer and is selected from amoung copper, copper oxide and oxides and carbonates of alkaline earth metals which are components of said mixed metal oxide.

2. An article according to claim 1 further characterized in that the substrate is a monocrystalline body.

3. An article according to claim 1 further characterized in that a protective coating overlies said mixed metal oxide layer.

4. An article according to claim 1 further characterized in that a layer of a photoresist overlies said mixed metal oxide layer.

5. An article according to claim 1 futher characterized in that said mixed metal oxide includes copper oxide and said lift-off layer consists essentially of copper oxide.

6. An article according to claim 5 further characterized in that said lift-off layer is not more than about 1,000 Å thick.

7. An article according to claim 1 further characterized in that said mixed metal oxide layer comprises a mixture of oxides selected from the group consisting of (a) a mixture of a rare earth oxide, an alkaline earth oxide or carbonate, and copper oxide, (b) a mixture of a heavy pnictide, an alkaline earth oxide or carbonate and copper oxide, and (c) a mixture of thallium oxide, a mixed alkaline earth oxide or carbonate and copper oxide.

8. An article according to claim 5 further characterized in that the proportions of the components of said mixed metal oxides are selected to form a crystalline compound superconductive layer upon heating to a temperature which causes compound formation and crystal growth of said mixed oxide layer.

9. An article according to claim 7 further characterized in that said lift-off layer is copper oxide.

10. An article according to claim 5 further characterized in that the metal of said mixed metal oxide layer is comprised of a rare earth, alkaline earth and copper oxide.

11. An article according to claim 5 further characterized in that the metal of said mixed metal oxide layer is comprised of bismuth, at least two alkaline earth elements and copper.

12. An article according to claim 1 further characterized in that said lift-off layer is in the order of about 250 to 750 Å thick.

13. A process comprising forming a mixed metal oxide layer capable of forming upon heating a conductive crystalline mixed metal oxide thin film having a superconductive transition temperature of greater then 30° K. comprising
applying to a substrate capable of withstanding temperatures required to form said thin film a readily etchable, thin lift-off layer selected from amoung copper, copper oxide and oxides and carbonates of alkaline earth metals which are components of said mixed metal oxide and
then forming said mixed metal oxide layer on said thin lift off layer.

14. A process according to claim 13 in which said lift-off layer is formed by applying to the substrate a metal organic compound consisting of a metal forming a permanent part of the lift-off layer and one or more organic ligands each having less than 30 carbon atoms and thermally decomposing said ligands to leave the desired metal containing lift-off layer.

15. A process according to claim 13 further characterized in that said mixed metal oxide layer is converted to said thin film by heating.

16. A process according to claim 13 further characterized in that said lift-off layer is copper oxide and the metal of the mixed metal-oxide is chosen from the group consisting of (a) a mixture of a rare earth, alkaline earth and copper (b) a mixture of a heavy pnictide, at least two alkaline earth elements and copper and (c) a mixture of thallium, at least two alkaline earth elements and copper.

17. A process according to claim 16 further characterized in that said mixture is of type (a) wherein the molar ratio of rare earth:alkaline earth:copper is 1:2:3.

18. A process according to claim 17 further characterized in that said rare earth is yttrium.

19. A process according to claim 13 further characterized in that said substrate is monocrystalline.

20. A process according to claim 13 further characterized in that said mixed oxide layer is coated with a protective coating.

21. A process according to claim 13 further including the steps of coating said mixed metal oxide layer with a photoresist layer, exposing said photoresist to radiation through a mask to define a pattern in said photoresist, developing said pattern, and chemically etching said mixed metal oxide layer and lift-off layer to leave the desired pattern essentially free of unwanted residue.

22. A process according to claim 21 further including heating said substrate to form a conductive crystalline compound in a pattern in accordance with said patterned mixed metal oxide layer.

23. A process according to claim 13 wherein said lift-off layer is in the order of about 250–1,000 Å thick.

24. A process comprising forming a mixed metal oxide layer on a substrate characterized by the steps of forming a copper oxide lift-off layer having a thickness of ≦1,000 Å on a monocrystalline substrate, forming on said copper oxide lift-off layer a mixed metal oxide layer selected from a rare earth alkaline earth copper oxide layer and a bismuth alkaline earth copper oxide layer which mixed metal oxide layer is capable of forming a superconducting thin film upon crystalline thereof at an elevated temperature, said substrate being selected to withstand said crystallization temperature.

25. A process according to claim 24 further characterized in that a pattern is chemically etched into said layers.

26. A process according to claim 25 further characterized in that subsequent to pattern formation, the resulting patterned mixed oxide layer is heated to form a patterned crystalline superconducting thin film.

27. A superconducting circuit made by the process according to claim 26.

28. A process of forming a patterned superconducting article which is essentially free of unwanted oxide residue comprising (a) forming on a substrate capable of withstanding the heating step recited below a lift-off layer having a thickness of ≦1,000 Å selected from the group consisting of copper and copper oxide; (b) forming a mixed metal oxide layer over said lift-off layer, said mixed metal oxide layer having a thickness of <5 μm and comprising copper oxide, said mixed metal oxide being capable of forming a superconducting compound having a superconducting transition temperature of greater than 30° K. upon heating thereof; (c) forming a pattern in said mixed metal oxide layer by means of application of a photoresist, exposure of the photoresist to radiation in accordance with said pattern, development of said pattern and chemical etching of said mixed oxide layer and underlying lift-off layer in accordance with said pattern; and (d) heating the patterned mixed metal oxide to a temperature sufficient to cause formation and crystal growth of the superconducting compound.

29. The process according to claim 28 further characterized in that the lift-off layer is copper oxide and the metal of the mixed metal oxide is selected from the group consisting of (a) a yttrium, an alkaline earth and copper, (b) a bismuth, at least two alkaline earth metals and copper, and (c) a thallium at least two alkaline earth metals and copper.

30. An article capable of forming on heating a superconducting thin film of less than 5 μm in thickness having a superconducting transition temperature of greater than 30° K. comprising a substrate capable of withstanding heating to form the thin film and a mixed metal oxide layer consisting essentially of a mixture of a rare earth oxide, an alkaline earth oxide or carbonate, and copper oxide, characterized in that a lift off layer of a thickness of up to 1000 Å consisting essentially of copper oxide is interposed between said substrate and said mixed metal oxide layer.

31. A process comprising forming a mixed metal oxide layer capable of forming on heating a thin film of less than 5 μm in thickness having a superconducting transition temperature of greater than 30° K. consisting essentially of a mixture of a rare earth oxide, an alkaline earth oxide or carbonate, and copper oxide, comprising applying to a substrate capable of withstanding temperatures required to form said thin film a lift off layer of a thickness of up to 1000 Å consisting essentially of copper oxide and then forming said mixed metal oxide layer on said thin lift-off layer.

* * * * *